United States Patent
Sumi

(10) Patent No.: US 6,943,485 B2
(45) Date of Patent: Sep. 13, 2005

(54) PIEZOELECTRIC ACTUATOR, LIQUID JETTING HEAD AND LIQUID JETTING DEVICE USING THE SAME

(75) Inventor: Koji Sumi, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 202 days.

(21) Appl. No.: 10/367,723

(22) Filed: Feb. 19, 2003

(65) Prior Publication Data

US 2003/0222943 A1 Dec. 4, 2003

(30) Foreign Application Priority Data

Feb. 19, 2002 (JP) .............................. 2002-041964

(51) Int. Cl.$^7$ .................. H01L 41/04; H01L 41/16; H01L 41/187
(52) U.S. Cl. .................. 310/357; 310/363; 310/358
(58) Field of Search ............... 310/324, 358, 310/363, 357; 367/163, 70, 71

(56) References Cited

U.S. PATENT DOCUMENTS

| | | | | |
|---|---|---|---|---|
| 5,438,554 A | * | 8/1995 | Seyed-Bolorforosh et al. | 367/140 |
| 5,541,422 A | * | 7/1996 | Wolf et al. | 257/9 |
| 6,620,237 B2 | * | 9/2003 | Hoisington | 117/68 |
| 6,739,703 B2 | * | 5/2004 | Higuchi et al. | 347/70 |
| 6,779,878 B2 | * | 8/2004 | Higuchi et al. | 347/70 |
| 2003/0218644 A1 | * | 11/2003 | Higuchi et al. | 347/1 |
| 2003/0222943 A1 | * | 12/2003 | Sumi | 347/68 |
| 2003/0222947 A1 | * | 12/2003 | Tomozawa et al. | 347/68 |
| 2004/0084994 A1 | * | 5/2004 | Iwashita et al. | 310/311 |
| 2004/0104981 A1 | * | 6/2004 | Fujii et al. | 347/71 |
| 2004/0135851 A1 | * | 7/2004 | Xin-Shan et al. | 347/68 |

FOREIGN PATENT DOCUMENTS

| | | | | |
|---|---|---|---|---|
| JP | 08-316098 A | 11/1996 | | H01G/4/33 |
| JP | H11-26926 | 1/1999 | | H01G/7/06 |
| JP | H11-274419 | 10/1999 | | H01L/27/10 |
| JP | 2000-91656 | 3/2000 | | H01L/41/09 |
| JP | 2001-60731 | 3/2001 | | H01L/41/22 |
| JP | 2001-122698 | 5/2001 | | C30B/29/24 |

* cited by examiner

Primary Examiner—Darren Schuberg
Assistant Examiner—J. Aguirrechea
(74) Attorney, Agent, or Firm—Sterne, Kessler, Goldstein & Fox P.L.L.C.

(57) ABSTRACT

It is an object of the present invention to provide a piezoelectric actuator which uses strontium ruthenate as the material of the bottom electrode, and which uses PMN-PT as the material of the piezoelectric layer. This piezoelectric actuator comprises a base layer (31, 20) of $SiO_2$ or Si ((100) orientation or (110) orientation), a buffer layer (41) constituted by strontium ruthenate (SRO), and a piezoelectric layer (44) constituted by a relaxor dielectric (PMN-PT) with a rhombohedral or quasi-cubic crystal structure oriented in the (001) direction at room temperature.

11 Claims, 9 Drawing Sheets

(a)

TOP ELECTRODE (Ir)

PIEZOELECTRIC LAYER
(PMN-PT)

BOTTOM ELECTRODE
(SRO)

(b)

PIEZOELECTRIC ACTUATOR, LIQUID JETTING HEAD AND LIQUID JETTING DEVICE USING THE SAME

BACKGROUND OF THE INVENTION

1. Field of the Invention

The present invention relates to a piezoelectric actuator comprising a piezoelectric layer that is formed by crystallizing a ferroelectric material, and more particularly relates to a piezoelectric actuator which comprises strontium ruthenate in the bottom electrode, and PMN-PT in the piezoelectric layer.

2. Description of the Related Art

Piezoelectric actuators are constructed by sandwiching a piezoelectric layer that has an electro-mechanical transducing capacity between two electrodes. Electrostrictive ceramics and piezoelectric ceramics are known as material used in such a piezoelectric layer. In order to improve the characteristics of piezoelectric actuators, research has been pursued both from the standpoint of the ceramic material that forms the piezoelectric layer and the bottom electrode material that forms the substrate on which the piezoelectric layer is crystallized.

Composite oxides which have a perovskite crystal structure, and which can be expressed by the chemical formula $ABO_3$ are known as piezoelectric ceramics. For examples lead zirconate titanate (PZT) in which lead (Pb) is used as A, and a mixture of zirconium (Zr) and titanium (Ti) is used as B, is well known. Besides PZT, there is also barium titanate ($BaTiO_3$) which is advantageous in that no lead is used, and which also offers the advantages of a large amount of displacement, inexpensive raw materials and an extensive record of use.

Furthermore, relaxor ferroelectric materials have attracted attention as materials that have a large electro-mechanical coupling factor and piezoelectric coefficient, and that can be used in place of PZT type ceramics. In regard to relaxor ferroelectric materials, for example, PMN-PT (Pb ($Mg_{1/3}Nb_{2/3}$)$O_3$—$PbTiO_3$) and PZN-PT (Pb($Zn_{1/3}Nb_{2/3}$)$O_3$—$PbTiO_3$) may be cited as examples of important materials.

Traditionally, metal materials such as Pt or the like have been used as electrode materials. In recent years, however, strontium ruthenate ($SrRuO_3$ or the like) has attracted attention. The reason for this is that since strontium ruthenate has a perovskite crystal structure similar to that of PZT type piezoelectric layers, the joining characteristics at the interface are superior so that the epitaxial growth of PZT or the like can easily be realized. Furthermore, this material is also superior in terms of characteristics as a barrier layer that prevents the diffusion of Pb in the piezoelectric layer.

By combining a piezoelectric layer consisting of PZT with electrodes consisting of strontium ruthenate, it is possible to provide a piezoelectric actuator that has good characteristics. For example, a composite electrode structure using a buffer layer in a case where a dielectric layer consisting of PZT is formed on a bottom electrode consisting of strontium ruthenate is disclosed in Japanese Patent Application Laid-Open No. 2001-122698.

However, it is desirable that metal oxide electrodes consisting of strontium ruthenate or the like have lattice constants that match those of the ferroelectric material of, the piezoelectric layer that directly contacts such electrodes, and that the adhesion between the silicon substrate and the piezoelectric layer be good. The material of the buffer layer and the ferroelectric material of the piezoelectric layer cannot be arbitrarily combined. In concrete terms, the crystalline state of the oxide such a strontium ruthenate or the like that forms the bottom electrode must be controlled so that this structure matches the lattice constants of the ferroelectric material, and at the same time, this oxide must have chemical properties which are such that tight adhesion between the silicon substrate and bottom electrode is ensured.

What has been studied experimentally in the past is the structure of metal oxide electrodes in cases where PZT is used as the material of the piezoelectric layer. In cases where ferroelectric materials other than PZT have been used, it has not been clear what type of layer structure or crystalline state is required in such metal oxide electrodes. It may be predicted that good piezoelectric actuators can be provided in cases where relaxor ferroelectric materials such as PMN-PT, PZN-PT or the like (which have especially superior piezoelectric characteristics) are used together with metal oxide electrodes consisting of barium titanate or the like (which are desirable from the standpoint of protection of the environment).

SUMMARY OF THE INVENTION

It is a particular object of the present invention to provide a piezoelectric actuator which uses a metal oxide such as strontium ruthenate or the like as the material of the bottom electrode, and which uses PMN-PT as the ferroelectric material that forms the piezoelectric layer. Furthermore, it is also an object of the present invention to provide a liquid jetting head which comprises this piezoelectric actuator.

The piezoelectric actuator of the present invention comprises a base layer, a buffer layer comprising an oxide which is formed on top of the base layer, a pair of electrodes in which the electrode adjacent to the buffer layer comprises strontium ruthenate, and a piezoelectric layer comprising a relaxor dielectric which is formed between the electrode pair.

The reason for this is as follows: namely, as a result of the presence of the oxide, the orientation of the electrodes containing strontium ruthenate can be controlled to a (001) orientation, and a piezoelectric layer comprising a relaxor dielectric which has a perovskite crystal structure can be epitaxially grown on the strontium ruthenate controlled to an orientation of (001).

In this case, the relaxor dielectric has a rhombohedral or quasi-cubic crystal structure with a (001) orientation at room temperature. PMN-PT may be cited as an example of such a relaxor dielectric.

In concrete terms, the composition ratio x is in the range of 0.6 to 0.8 in a case where the relaxor dielectric is expressed as $PMN_x$-$PT_{(1-x)}$.

For example, the buffer layer may consist of one or more materials selected from a group consisting of strontium oxide, cerium oxide and yttrium-stabilized zirconium (YSZ).

In more concrete terms, a metal oxide with a (100) orientation is suitable as the material of the buffer layer. In this case, the base layer is constructed from amorphous silicon oxide.

Furthermore, a metal oxide with a (110) orientation may also be used as the material of this buffer layer. Strontium oxide may be cited as an example of a metal oxide that can be used in this case. In this case, the base layer is constructed from silicon with a (100) orientation or (110) orientation.

The present invention also provides a liquid jetting head comprising a piezoelectric actuator of the construction described above. Furthermore, the present invention also provides a printer comprising such a liquid jetting head.

In the piezoelectric actuator of the present invention, the piezoelectric layer can be formed from a material that is superior in terms of electro-mechanical transducing characteristics and piezoelectric characteristics while guaranteeing tight adhesion to the base layer. Accordingly, a head and printer that are superior in terms of durability and superior in terms of ink jetting performance can be provided.

Furthermore, the piezoelectric actuator of the present invention can be installed in a liquid jetting head, and can be used not only in ink jet recording heads or printers used in printing applications, but also in liquid jetting heads used to jet industrial materials for the purpose of display device manufacture or substrate printing, and in devices using such heads. Furthermore, the layer structure of this piezoelectric actuator can be used in ferroelectric devices, dielectric devices, pyro-electric devices, piezoelectric devices and electro-optical devices such as dielectric memories, ferroelectric capacitors, non-volatile semiconductor memory devices, thin-film capacitors, pyro-electric detectors, sensors, surface elastic wave optical waveguides, optical memory devices, spatial optical modulators, diode laser frequency doubling devices and the like.

DESCRIPTION OF THE PREFERRED EMBODIMENTS

Next, preferred embodiments of the present invention will be described with reference to the attached figures.
(Embodiment 1)

Figure 1:
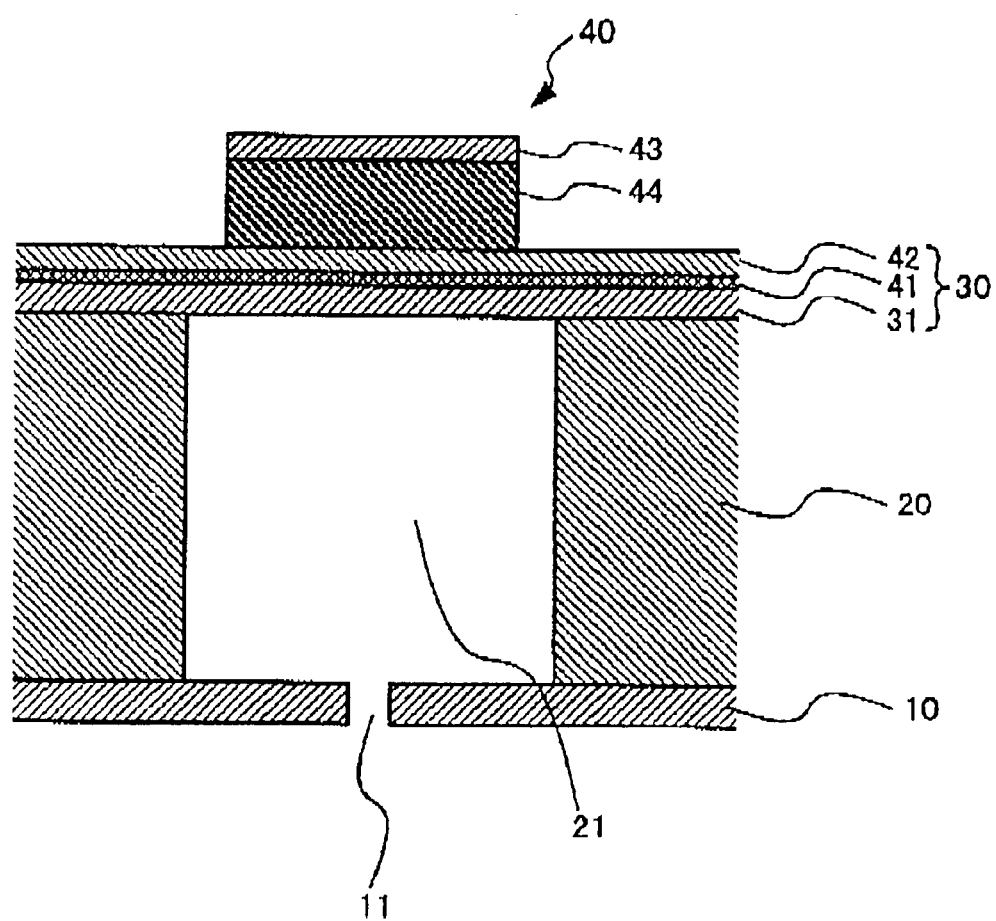
FIG. 1 is a cross-sectional view which illustrates the layer structure of a piezoelectric actuator according to Embodiment 1 of the present invention.

Embodiment 1 of the present invention relates to a piezoelectric actuator which uses a metal oxide in the bottom electrode, and which uses a relaxor ferroelectric material in the piezoelectric layer. The present embodiment is a piezoelectric actuator which is suitable for use in (for example) an ink jet recording head, FIG. 1 shows a partial cross-sectional view which illustrates the piezoelectric actuator of Embodiment 1 and the layer structure of the ink jet recording head equipped with this piezoelectric actuator. FIG. 1 is an enlarged view of one of the ink jetting elements.

As is shown in FIG. 1, the piezoelectric actuator 40 is constructed by laminating a buffer layer 41, bottom electrode 42, piezoelectric layer 44 and top electrode 43 on an insulating film 31. In regard to the constituent elements that relate to the ink jet recording head, the device comprises a pressure chamber substrate 20 in which a pressure chamber 21 that holds the ink is formed, a nozzle plate 10 having a nozzle 11 from which ink droplets are jetted, and the abovementioned insulating film 31 which is constructed so that this film can vibrate in accordance with the displacement of the piezoelectric actuator 40 in order to apply pressure to the ink held in the pressure chamber 21 (see FIG. 5). In the present embodiment, the buffer layer 41 and bottom electrode 42 are formed so that these parts are superimposed on more or less the entire surface of the insulating film 31; accordingly, the insulating film 31, buffer layer 41 and bottom electrode 42 as a whole function as a diaphragm 30.

The pressure chamber substrate 20 is constructed from an easily worked material which has the required mechanical strength and chemical resistance, e.g., silicon. The thickness of this substrate is determined in accordance with the specifications of the head; in cases where a silicon single-crystal substrate (wafer) is used, this thickness is the thickness of the substrate. In the case of an ink jet recording head, the dimensions of the pressure chamber 21 are determined in accordance with the required resolution. For example, the pressure chamber substrate 20 has a (100) orientation or (110) orientation.

Furthermore, in cases where there is no need to install an insulating film 31, e.g., in cases where this piezoelectric actuator is used in a device other than an ink jet recording head, the abovementioned pressure chamber substrate 20 can be used to act as the base layer of the present invention.

The insulating film 31 is constructed from a non-conductive material possessing elasticity and mechanical strength that allow the film to function as the diaphragm of an ink jet recording head, e.g., amorphous silicon oxide ($SiO_2$) or zirconium oxide ($ZrO_2$), or a laminate of silicon oxide and zirconium oxide. In the present embodiment, this insulating film constitutes the base film of the present invention.

The buffer layer 41 is constructed from a metal oxide, e.g., strontium oxide, cerium oxide or the like. The buffer layer may also have a laminated structure in which such metal oxides are laminated with another layer, e.g., yttrium-stabilized zirconium (YSZ) or the like. In cases where an amorphous insulating film 31 is installed as the base layer, the orientation of the buffer layer 41 is set at (100), so that the epitaxial crystal growth of a bottom electrode 42 with a (001) orientation is facilitated. Furthermore, in cases where no insulating film is used, and a silicon substrate with a (100) orientation or (110) orientation is used directly, the buffer layer has a (110) orientation, so that a bottom electrode with a (001) orientation can be grown while ensuring adhesion to the silicon substrate.

Figure 2:
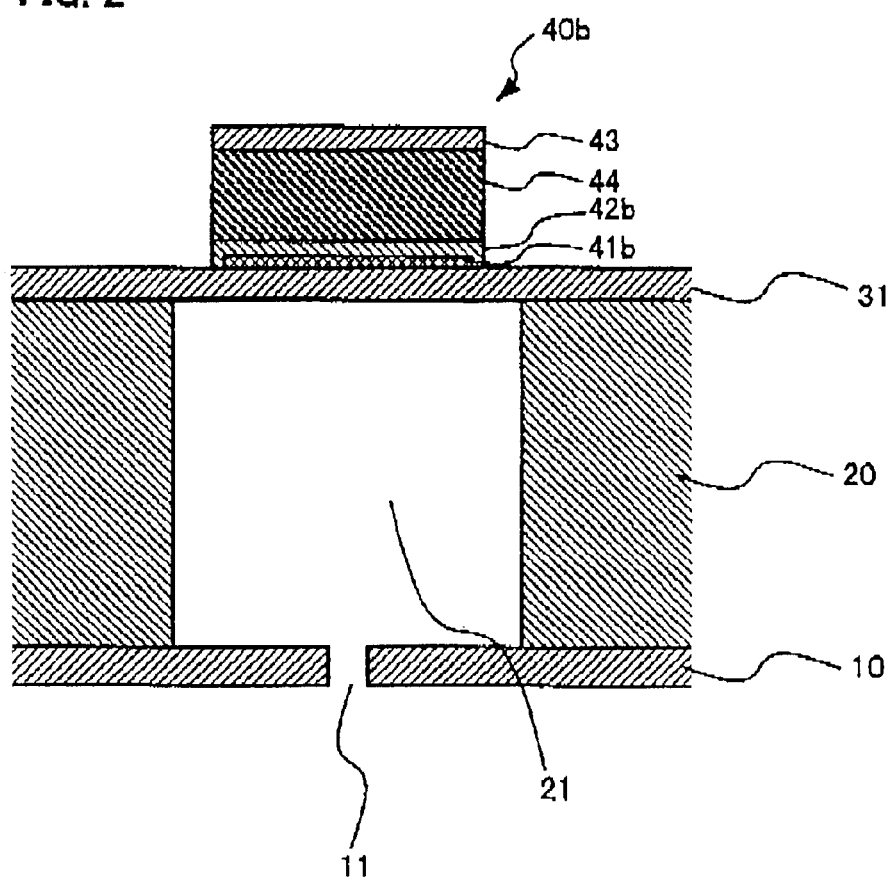
FIG. 2 is a cross-sectional view which illustrates the layer structure of a piezoelectric actuator constituting a modification of Embodiment 1.

Furthermore, in cases where the diaphragm is formed only by the insulating film 31 as shown in FIG. 2, it is desirable that the buffer layer 41b be patterned in a region that is smaller than the region in which the bottom electrode is formed, and that the bottom electrode 42b be formed so as to cover this buffer layer 41b. In this way, the strontium oxide, which is deliquescent, is prevented from contacting the outside air.

The bottom electrode 42 constitutes one of the electrode pair between which the piezoelectric layer 44 is sandwiched, and is formed in the same region as the insulating film 31 so that this electrode functions as an electrode that is common to a plurality or piezoelectric actuators 40 formed on the pressure chamber substrate 20. However, it would also be possible to form this bottom electrode with the same size as the piezoelectric layer 44, i.e., with the same shape as the top electrode, as shown in FIG. 2. The bottom electrode 42 is constructed from a conductive metal oxide, i. e., in concrete terms, strontium ruthenate (SRO). The strontium ruthenate of this bottom electrode has a (001) orientation. The bottom electrode 42 may also have a structure in which a layer of iridium or platinum is sandwiched between two layers of SRO. Here, the SRO has a perovskite structure, and can be expressed as $Sr_{n+1}Ru_nO_{3n+1}$ (n is an integer equal to or greater than 1). In cases where n=1, the compound is $Sr_2RuO_4$; furthermore, in cases where n=2, the compound is $Sr_3Ru_2O_7$, and in cases where n=∞, the compound is $SrRuO_3$. When SRO is used as the material of the bottom electrode in the present embodiment, it is desirable that the composition of this SRO be $SrRuO_3$ in order to heighten the conductivity and crystallinity of the piezoelectric layer. Furthermore, in cases where a structure in which a layer of iridium or platinum is sandwiched between two layers of SRO as described above, it is desirable that the SRO adjacent to the piezoelectric layer be $SrRuO_3$.

The piezoelectric layer 44 is a piezoelectric ceramic which has a perovskite crystal structure, and is formed with a specified shape on the bottom electrode 42. The composition of the piezoelectric layer 44 is a relaxor dielectric. For example, PMN-PT ($Pb(Mg_{1/3}Nb_{2/3})O_3$—$PbTiO_3$) may be used as a relaxor ferroelectric material. The composition ratios of the respective elements are not strictly limited, and may vary slightly as long as there is no loss of the intrinsic characteristics of the material. For example, in a case where the composition of PMN-PT is expressed as $PMN_xPT_{(1-x)}$ it is desirable that the piezoelectric layer be constructed with the composition controlled so that the composition ratio x is within the range of 0.6 to 0.8. This relaxor dielectric has a rhombohedral or quasi-cubic crystal structure with a (001) orientation at room temperature. A relaxor dielectric crystal which thus has a rhombohedral or quasi-cubic crystal structure with a (001) orientation can be grown on the surface of a bottom electrode constructed from a metal oxide with a (001) orientation.

The top electrode 43 is the other electrode of the electrode pair that apply a voltage to the piezoelectric layer 44; this electrode 43 is constructed from a material that possesses conductivity, e.g., platinum (Pt), iridium (Ir), aluminum (Al) or the like. In cases where aluminum is used, it is desirable that iridium or the like be laminated on this as a countermeasure against electrolytic corrosion.

The manufacturing process of the piezoelectric actuator and ink jet recording head of the present embodiment will be described with reference to the manufacturing process cross-sectional views shown in FIGS. 3 and 4.

Figure 3:
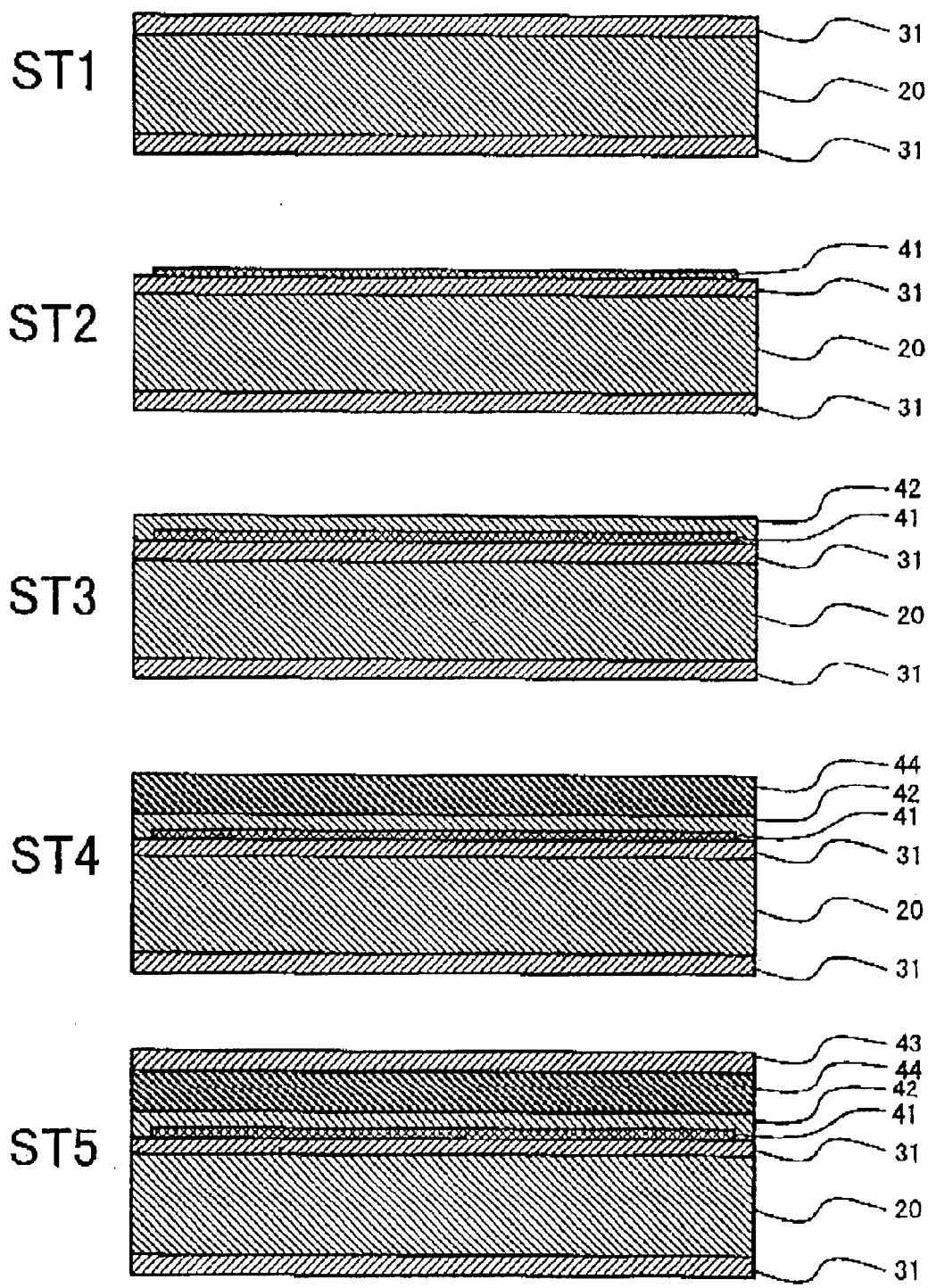
FIG. 3 is a manufacturing process cross-sectional view which illustrates the manufacturing method used to manufacture the piezoelectric actuator of Embodiment 1.

In the substrate and insulating film formation process, as is shown in FIG. 3 (ST1), an insulating film 31 is formed as a diaphragm on a pressure chamber substrate 20. For example, a silicon single-crystal substrate with a diameter of 100 mm, a thickness of 200 μm and an orientation of (110) is used as the pressure chamber substrate 20. The insulating film 31 is formed by thermally oxidizing the surface of the silicon substrate. For example, an amorphous thermally oxidized film with a thickness of 2 μm or less, preferably a thickness of approximately 1 μm, is formed by causing dry oxygen to flow through a furnace at approximately 1100° C., and thermally oxidizing the substrate for approximately 22 hours. In this method, an insulating film 31 consisting of $SiO_2$ is formed on both surfaces of the silicon substrate. One of these insulating films 31 is used as the diaphragm.

Furthermore, besides a thermal oxidation process, it would also be possible to form a film by appropriately selecting a film formation method such as a CVD method or the like. Moreover, the insulating film 31 is not limited to silicon dioxide, but may also be formed from zirconium oxide or from a laminated film of zirconium oxide and silicon dioxide.

In the buffer layer formation process, as is shown in FIG. 3 (ST2), a buffer layer 41 consisting of strontium oxide (SrO) is formed on the surface of the insulating film 31 by (for example) an RF sputtering process. In order to guarantee adhesion at the interface, and because SrO is deliquescent, it is desirable that the film thickness of the buffer layer consisting of SrO be small, e.g., a thickness of 30 nm or less. The buffer layer 41 is not limited to a sputtering method, but may also be formed by a laser ablation method, PVD method (physical vapor deposition method) or the like. As a result of this process, an SrO film with an in-plane orientation (biaxial orientation) in (001) is formed.

Furthermore, in cases where an insulating film is not used, and a buffer layer is formed directly on the surface of a silicon substrate with a (100) orientation or (110) orientation, the orientation of the SrO of the buffer layer is (110).

After the buffer layer has been formed over the entire surface of the insulating film 31, the periphery of the buffer layer 41 is selectively etched by anisotropic etching or the like as shown in FIG. 3 (ST2). As a result, the buffer layer 41 has a structure which is completely covered by the insulating film 31 and bottom electrode 42 when the bottom electrode is subsequently formed. In cases where the buffer layer consists of a deliquescent material, the air is blocked by this sealed structure.

Furthermore, in order to construct the piezoelectric actuator with the layer structure shown in FIG. 2, the buffer layer that is formed over the entire surface is patterned so that this layer has an area that is slightly smaller than the shapes of the respective piezoelectric layers.

In the bottom electrode formation process, as is shown in FIG. 3 (ST3), a bottom electrode 42 is formed on the surface of the buffer layer 41. The abovementioned SRO is formed to a specified thickness, e.g., approximately 500 nm, as the bottom electrode 42. For example, a laser ablation method is used as the film formation method. Furthermore, the present invention is not limited to this; for example, a universally known thin film manufacturing method such as an MOCVD method, etc., may also be used.

In the piezoelectric layer formation process, as is shown in FIG. 3 (ST4), a piezoelectric layer 44 is formed on the surface of the bottom electrode 42. In the present embodiment, the relaxor ferroelectric material, especially PMN-PT, is formed as a film using a universally known film formation method, e.g., a metalorganic deposition method (MOD method).

As a concrete example using an MOD method, the surface of the bottom electrode 42 is first coated with a sol consisting of an organic metal alkoxide solution by a coating method such as spin coating or the like. If PMN-PT is to be formed, a binary solid solution consisting of $Pb(Mg_{1/3}Nb_{2/3})O_3$ and $PbTiO_3$ is utilized. Next, the sol that has been applied as a coating is dried for a fixed period of time at a fixed temperature, so that the solvent is evaporated. After the sol has been dried, pyrolysing is further performed for a fixed time at a fixed high temperature in an air atmosphere, so that the organic ligands coordinated with the metal are thermally decomposed, thus producing a metal oxide. The respective processes of coating→drying→pyrolysing are repeated a specified number of times, so that a plurality of piezoelectric body precursor films are laminated. As a result of the drying and pyrolysing processes, the metal alkoxide and acetates in the solution form a metal-oxygen-metal network via thermal decomposition of the ligands. Next, these piezoelectric body precursor films are fired at a specified temperature and crystallized. As a result of this heat treatment, the perovskite crystal structure of the relaxor ferroelectric material is grown from the amorphous precursor while being influenced by the crystal structure of the bottom electrode.

Furthermore, in the present embodiment, the piezoelectric layer was formed using a MOD method; however, this formation may also be accomplished by some other method. For example, the piezoelectric layer may be formed using a sputtering method such as that described in Japanese Patent Application Laid-Open No. 8-316098.

In the present embodiment, in order to allow the epitaxial growth of a relaxor ferroelectric material on SRO with a (001) orientation, the piezoelectric layer 44 has a rhombohedral crystal structure with a (001) orientation at room temperature. The thickness of the piezoelectric thin-film layer is set at a thickness that allows desirable characteristics to be obtained without cracking.

As is shown in FIG. 3 (ST5), the top electrode formation process is a process in which a top electrode 43 is formed on the piezoelectric layer 44. In concrete terms, a film is formed from a material that possesses conductivity, e.g., platinum (Pt), iridium (Ir), aluminum (Al) or the like by a sputtering method. In cases where aluminum is used, it is desirable to laminate iridium or the like on this aluminum as a counter measure against electrolytic corrosion. The top electrode is formed to a film thickness of (for example) 100 nm.

The layer structure of the piezoelectric actuator is formed by the respective processes described above. When a specified voltage is applied across the bottom electrode 41 and top electrode 43, an electric field is generated between the two electrodes, and the crystal structure of the piezoelectric layer 44 is caused to generate strain by these electrodes in accordance with the piezoelectric coefficient. On the whole, this translates into a volume change of the piezoelectric actuator.

The abovementioned piezoelectric actuator is worked into a shape that is suited to the specifications of the device in which the piezoelectric actuator is to be used. There are no restrictions on possible applications; for example, one application is the ink jet recording head in the embodiment described below.

The present embodiment can provide a piezoelectric actuator which combines a piezoelectric layer consisting of a PMN-PT relaxor ferroelectric material that is superior in terms of piezoelectric characteristics, and electrodes using strontium ruthenate which is superior in terms of adhesion to the piezoelectric layer and base layer; this piezoelectric actuator is superior in terms of the characteristics of the piezoelectric body and in terms of durability.

EXAMPLE 1

A piezoelectric actuator was manufactured on the basis of Embodiment 1. In this example, a piezoelectric actuator was manufactured in which a laminated structure of strontium oxide, cerium oxide and yttrium-stabilized zirconium was formed as the buffer layer, a layer of strontium oxide with a (001) orientation was formed as the bottom electrode, and a piezoelectric layer consisting of a $PMN_{0.7}$-$PT_{0.3}$ relaxor dielectric material was grown on top of this bottom electrode. The thickness of the buffer layer was 100 nm, the thickness of the bottom electrode was 200 nm, and the thickness of the piezoelectric layer was 1000 nm.

Figure 7:
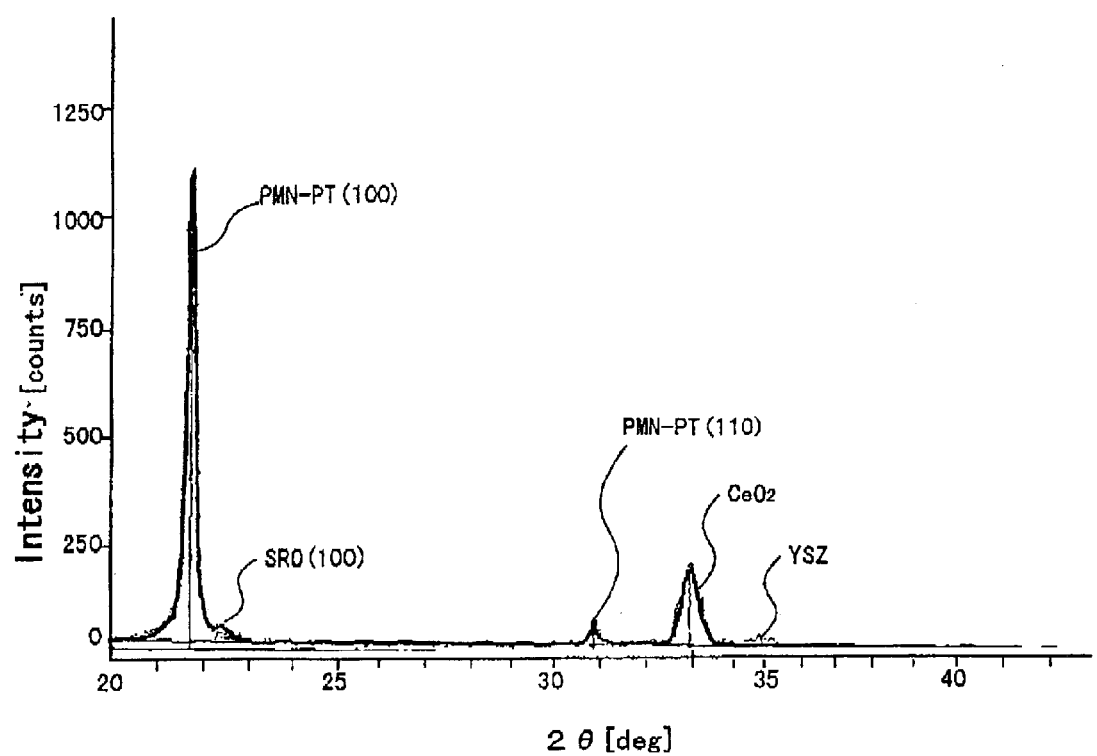
FIG. 7 is a θ·2θ XRD pattern diagram of X-ray diffraction analysis in the piezoelectric actuator of the embodiment.

FIG. 7 shows a $\theta\cdot2\theta$ XRD pattern diagram showing the results of X-ray diffraction analysis that was performed in order to investigate the orientation of the piezoelectric actuator of the present example. The piezoelectric layer shows a (001) orientation peak in the vicinity of 21.8°, and a (110) orientation peak in the vicinity of 31°. As is shown in FIG. 7, the (110) orientation is less than 5% of the (0.001) orientation, thus indicating that the abovementioned piezoelectric layer consisting substantially of PMN-PT shows a prevailing (001) orientation.

Figure 8:
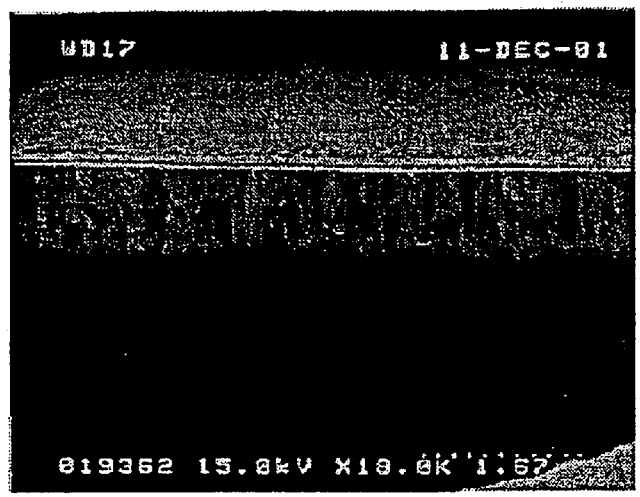
FIG. 8 shows cross-sectional SEM photographs of the layer structure of the piezoelectric actuator of the embodiment, with FIG. 8(a) showing an overall view, and FIG. 8(b) showing an enlarged view of a portion of FIG. 8(a)
Figure 8:
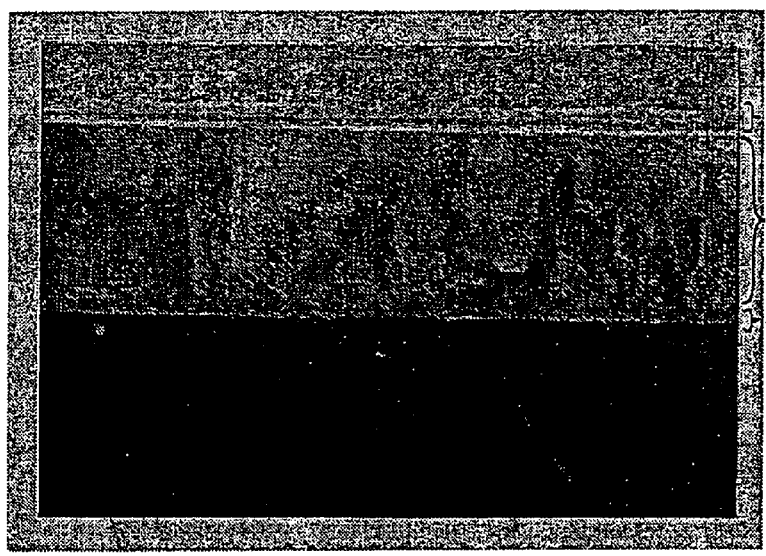

FIGS. 8(a) and (b) show cross-sectional SEM photographs projecting cross sections of the layer structure of the piezoelectric actuator of the present example with an electron microscope in order to investigate this layer structure. FIG. 8(b) is a partial enlargement of FIG. 8(a). As is shown in FIG. 8, it is confirmed that a columnar crystal of PMN-PT is grown on the surface of the bottom electrode consisting of strontium oxide in the piezoelectric actuator of the present example. A piezoelectric layer constructed from such a columnar crystal shows piezoelectric characteristics.

Figure 9:
FIG. 9 is a cross-sectional SEM photograph showing the layer structure obtained in a case where the formation of a piezoelectric layer consisting of PMN-PT was attempted on a Pt electrode in a comparative example.

FIG. 9 shows a comparative example in which a PZN-PT dielectric material was grown as a crystal on the surface of a bottom electrode formed from Pt. FIG. 9 shows a piezoelectric actuator in which a crystal film was manufactured. As is shown in FIG. 9, in a case where crystal growth was attempted on the bottom electrode consist of Pt as a conventionally used material, the PZN-PT crystal consisted of crystal grains with a small particle size, and did not form a columnar crystal of the type shown in FIGS. 8(a) and 8(b). If the crystal is not grown in columnar form, favorable piezoelectric characteristics cannot be expected; accordingly, it is seen that even if a piezoelectric layer consisting of a relaxor dielectric is formed on the surface of a conventional Pt electrode, a piezoelectric actuator cannot be obtained.

(Embodiment 2)

Embodiment 2 of the present invention relates to an ink jet recording head using the piezoelectric actuator of the present invention.

Figure 5:
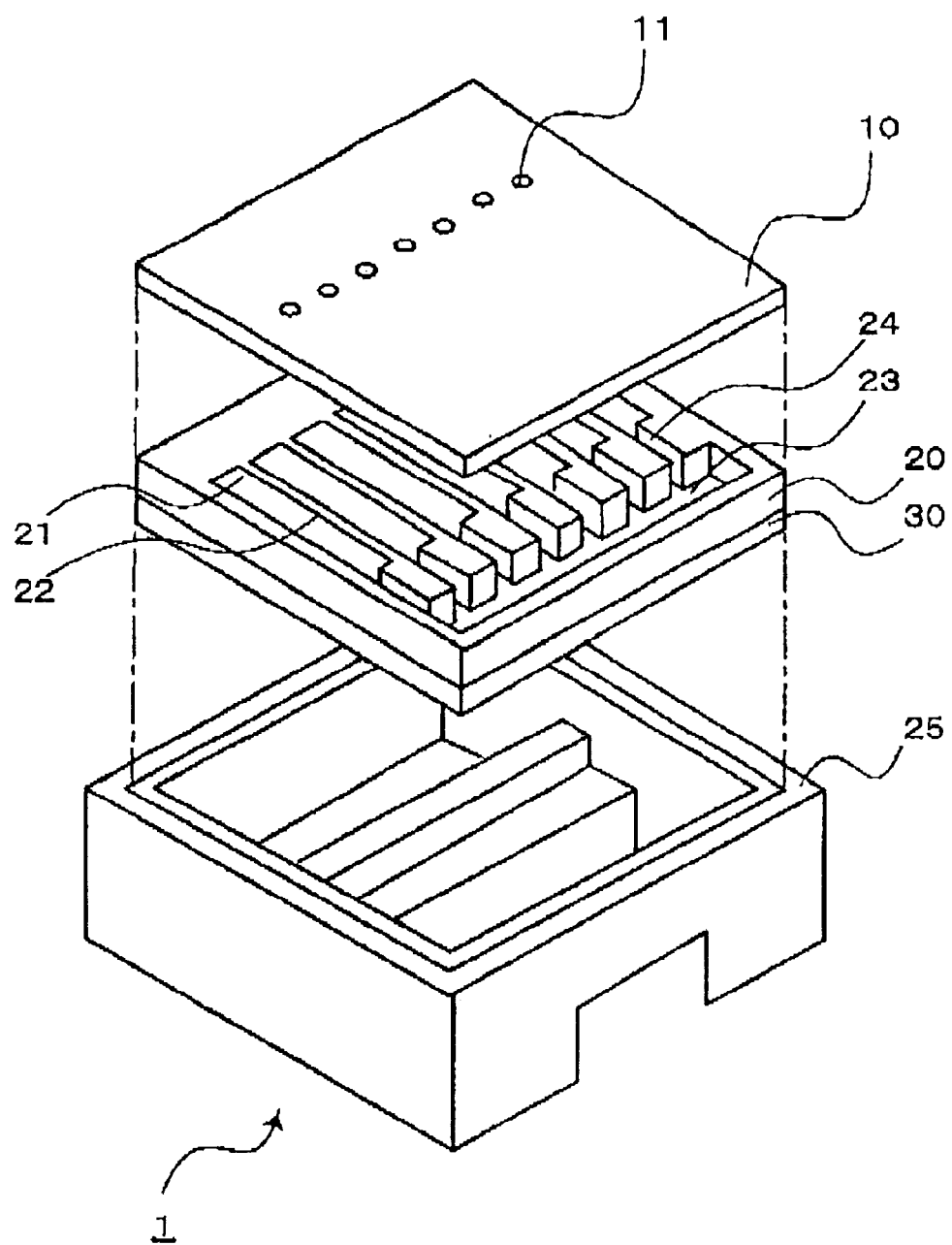
FIG. 5 is an exploded perspective static view which illustrates the structure of the ink jet recording head of Embodiment 2.

FIG. 5 shows an exploded perspective view of the ink jet recording head of the present embodiment. As is shown in FIG. 5, this ink jet recording head 1 comprises a pressure chamber substrate (silicon substrate) 20, a diaphragm 30 which is fastened to one side of the substrate 20, and which has the piezoelectric actuator 40 of the present invention (not shown in FIG. 5) formed on the back surface (the surface not shown in the figures), and a nozzle plate 10 which is fastened to the other side of the pressure chamber substrate 20. This head is constructed as an on-demand type piezo-jetting head. Either the piezoelectric actuator in which the piezoelectric layer is formed by a relaxor ferroelectric material as described in Embodiment 1, or the piezoelectric actuator in which the piezoelectric layer is formed by barium titanate as described in Embodiment 2, may be used as the piezoelectric actuator 40 in this embodiment.

The pressure chamber substrate 20 comprises pressure chambers (cavities or pressure chambers) 21, side walls (partition walls) 22, a reservoir 23 and supply ports 24. The pressure chambers 21 are spaces that accommodate the ink that is to be discharged. The side walls 22 are formed so that these side walls partition a plurality of pressure chambers 21. The reservoir 23 is a temporary storage part used in common to replenish the ink in the respective pressure chambers 21. The supply ports 24 are formed as supply ports that introduce ink into the respective pressure chambers 21 from the reservoir 23.

In the nozzle plate 10, nozzles 11 are disposed in positions corresponding to each of the pressure chambers 21 formed in the pressure chamber substrate 20, and the nozzle plate 10 is bonded to the pressure chamber substrate 20 in a positional relationship which is such that the respective nozzles correspond to the pressure chambers 21. The pressure chamber substrate 20 to which the nozzle plate 10 has been bonded is accommodated in a housing 25, and the system is constructed so that ink can be introduced into the pressure chamber substrate from an external ink tank via a supply path not shown in the figures.

As is shown in FIG. 1 and FIG. 3 (ST8), piezoelectric actuators 40 of the present invention are disposed on the diaphragm 30 in positions corresponding to the pressure chambers 21, and are wired so that a voltage can be applied in common (or so that voltages can be separately applied) across the bottom electrodes and top electrodes (although this is not shown in the figures). An ink tank port (not shown in the figures) is formed in the diaphragm 30, so that ink stored in an ink tank (not shown in the figures) can be supplied to the reservoir 23.

The operation that is performed in the construction of the abovementioned ink jet recording head 1 will be described.

In cases where a specified discharge signal is not output, so that no voltage is applied across the bottom electrodes 42 and top electrodes 43 of the piezoelectric actuators 40, no electric field is generated between the electrodes of these piezoelectric actuators 40; accordingly, no deformation occurs in the piezoelectric layers 44. Consequently, no pressure change is generated in the pressure chambers 21 on which the piezoelectric actuators 40 that do not receive a discharge signal are installed, so that ink droplets are not caused to jet from the corresponding nozzles 11.

On the other hand, when a specified discharge signal is output, so that a fixed voltage is applied across the bottom electrodes 42 and top electrodes 43 of the piezoelectric actuators 40, an electric field is generated between the electrodes of these piezoelectric actuators 40, so that deformation occurs in the piezoelectric layers 44. Furthermore, the diaphragm 30 shows a large deformation in the pressure chambers 21 on which the piezoelectric actuators 40 receiving the discharge signal are installed. As a result, the pressure inside these pressure chambers 21 instantaneously increases, so that ink droplets are caused to jet from the corresponding nozzles 11. Specifically, arbitrary characters and figures can be printed by separately supplying discharge signals to the piezoelectric actuators in positions where printing is desired.

Next, the method used to manufacture such an ink jet recording head will be described with reference to the manufacturing process cross-sectional views shown in FIG. 4. These cross-sectional views are a continuation of the piezoelectric actuator manufacturing process that was described in Embodiment 1 with reference to FIG. 3.

Figure 4:
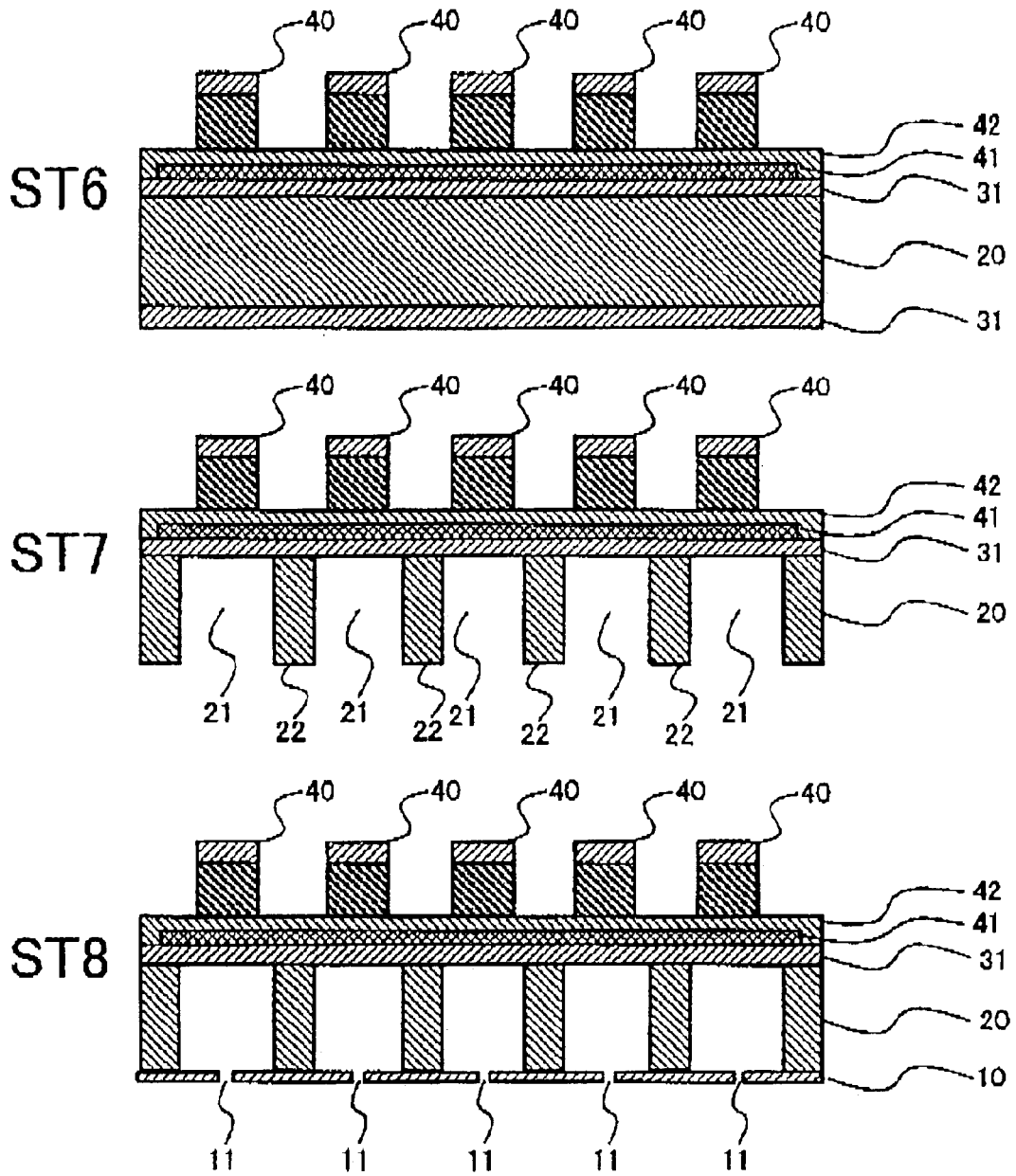
FIG. 4 is a manufacturing process cross-sectional view which illustrates the manufacturing method used to manufacture the ink jet recording head of Embodiment 2.

Following the formation of a piezoelectric actuator layer structure (see FIG. 3 (ST5)), individual piezoelectric actuators 40 are formed by etching the piezoelectric layer 44 and top electrode 43 to specified shapes as shown in FIG. 4 (ST6). For example, a photolithographic method is used for etching. First, a resist is applied the top electrode 43 by spin coating; afterward, patterning is performed by exposure and developing in accordance with the positions where the pressure chambers are to be formed. The top electrode 43 and piezoelectric layer 44 are then etched by a universally known method such as ion milling or the like with the resist that remains after the unnecessary resist has been cleaned away used as a mask. Piezoelectric actuators 40 are formed by the abovementioned processes.

Next, as is shown in FIG. 4 (ST7), the pressure chambers 21 are formed by etching the pressure chamber substrate 20. In the present embodiment, a silicon substrate with a (100) orientation or (110) orientation is used as the pressure chamber substrate 20; accordingly, anisotropic etching is used as the formation method for the pressure chambers 21. The portions that remain following etching form the side walls 22 that partition the individual units.

Finally, as is shown in FIG. 4 (ST8), the nozzle plate 10 is joined to the pressure chamber substrate 20 using a resin or the like. When the nozzle plate 10 is joined to the pressure chamber substrate 20, these parts are aligned so that the nozzles 11 are disposed in positions corresponding to the respective spaces of the pressure chambers 21. An ink jet recording head is formed by the abovementioned processes.

In cases where a PMN-PT relaxor ferroelectric material which is superior in terms of piezoelectric characteristics is used as a piezoelectric actuator in accordance with the present invention, an ink jet recording head which is superior in terms of both jetting characteristics and durability can be provided.

(Embodiment 3)

Embodiment 3 of the present invention relates to a printer utilizing the ink jet recording head of Embodiment 2.

Figure 6:
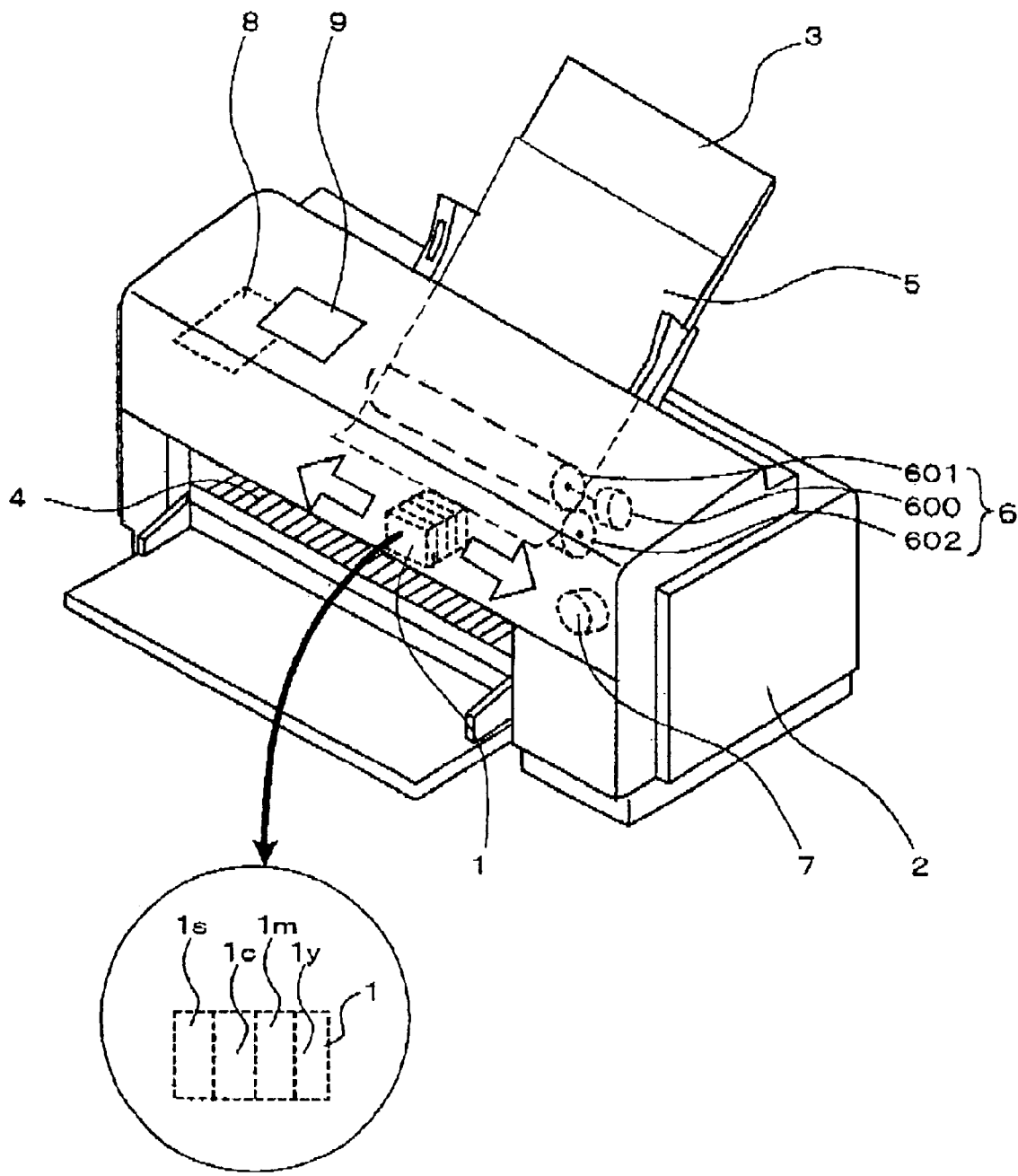
FIG. 6 is a perspective view which illustrates the structure of the printer of Embodiment 3.

FIG. 6 is a perspective view which shows the structure of an ink jet printer equipped with the piezoelectric actuator of the present invention. As is shown in FIG. 6, this ink jet printer comprises an ink jet recording head 1, a body 2, a tray 3, a discharge port 4, a paper supply mechanism 6, a head driving mechanism 7, a control circuit 8 and an operating panel 9.

For example, an ink jet recording head with the structure described in Embodiment 3 can be used as the ink jet recording head 1. However, this ink jet recording head may also have some other structure as long as the head is a piezo-jetting type head. In concrete terms, an ink jet recording head 1 has four heads each corresponding to four ink cartridges of the colors yellow, magenta, cyan and black, so that full-color printing is possible.

The paper supply mechanism 6 comprises a motor 600 and rollers 601 and 602; this mechanism is arranged so that paper 5 carried in the tray 3 can be introduced into the body 2 in accordance with control signals from the control circuit 8.

The head driving mechanism 7 comprises a motor and constituent elements not shown in the figures; this mechanism is constructed so that the heads 1 can be appropriately moved in accordance with the position of the supplied paper 5 as directed by control signals from the control circuit 8, and so that ink of the appropriate color can be caused to jet from the heads 1 at a timing corresponding to the discharge signals supplied from the control circuit 8.

Paper 5 which has been supplied by the paper supply mechanism 6 and on which printing has been performed by the head driving mechanism 7 is discharged from the discharge port 4.

In cases where head piezoelectric actuator consisting of a PMN-PT relaxor ferroelectric material that is superior in terms of piezoelectric characteristics is used in accordance with the present invention, a printer that is superior in terms of both jetting characteristics and durability can be provided.

In the present invention, a piezoelectric layer consisting of PMN-PT, which is a relaxor ferroelectric material that is superior in terms of piezoelectric characteristics, is combined with an electrode using strontium ruthenate, which is superior in terms of adhesion to the piezoelectric layer and base layer. Accordingly, a piezoelectric actuator which is superior in terms of both piezoelectric characteristics and durability can be provided. Furthermore, a liquid jetting head which is equipped with this piezoelectric actuator, and which is superior in terms of piezoelectric characteristics and durability, and a liquid jetting device using this liquid jetting head, can also be provided.

What is claimed is:

1. A piezoelectric actuator comprising:
   a base layer;
   a buffer layer comprising an oxide which is formed on top of said base layer;
   a pair of electrodes in which an electrode adjacent to said buffer layer comprises strontium ruthenate; and
   a piezoelectric layer comprising a relaxor dielectric which is formed between said electrode pair,
   wherein said relaxor dielectric constituting said piezoelectric layer has a crystal structure of the rhombohedral type or quasi-cubic type with a (001) orientation at room temperature.

2. The piezoelectric actuator according to claim 1, wherein said relaxor dielectric is PMN-PT.

3. The piezoelectric actuator according to claim 1, wherein the composition ratio x is in the range of 0.6 to 0.8 in a case where said relaxor dielectric is expressed as PMNx-PT(1−x).

4. The piezoelectric actuator according to claim 1, wherein said electrode that contains strontium ruthenate has a (001) orientation.

5. The piezoelectric actuator according to claim 1, wherein said buffer layer comprises one or more materials selected from a group consisting of strontium oxide, cerium oxide and yttrium-stabilized zirconium.

6. The piezoelectric actuator according to claim 1, wherein said buffer layer comprises a metal oxide that has a (001) orientation.

7. The piezoelectric actuator according to claim 6, wherein said base layer comprises amorphous silicon oxide.

8. The piezoelectric actuator according to claim 1, wherein said buffer layer comprises a metal oxide that has a (110) orientation.

9. The piezoelectric actuator according to claim 8, wherein said base layer comprises silicon that has a (100) orientation or (110) orientation.

10. A liquid jetting head comprising the piezoelectric actuator according to any preceeding claim.

11. A liquid jetting device comprising the liquid jetting head according to claim 10.

* * * * *